US012800668B2

(12) United States Patent
Ikeda et al.

(10) Patent No.: US 12,800,668 B2
(45) Date of Patent: Nov. 17, 2026

(54) METHOD FOR INSPECTING A POWER STORAGE DEVICE FOR SHORT CIRCUIT AND METHOD FOR MANUFACTURING A CONNECTED RESTRAINED-DEVICE MODULE

(71) Applicants: Prime Planet Energy & Solutions, Inc., Tokyo (JP); TOYOTA JIDOSHA KABUSHIKI KAISHA, Aichi-ken (JP); PRIMEARTH EV ENERGY CO., LTD., Shizuoka-ken (JP)

(72) Inventors: Hiroaki Ikeda, Toyota (JP); Toshiki Yoneyama, Toyohashi (JP)

(73) Assignees: PRIME PLANET ENERGY & SOLUTIONS, INC., Tokyo (JP); TOYOTA JIDOSHA KABUSHIKI KAISHA, Aichi-Ken (JP); TOYOTA BATTERY CO., LTD., Shizuoka-Ken (JP)

( * ) Notice: Subject to any disclaimer, the term of this patent is extended or adjusted under 35 U.S.C. 154(b) by 589 days.

(21) Appl. No.: 18/353,889

(22) Filed: Jul. 18, 2023

(65) Prior Publication Data

US 2024/0103089 A1 Mar. 28, 2024

(30) Foreign Application Priority Data

Sep. 22, 2022 (JP) ................................ 2022-150807

(51) Int. Cl.
*H01M 50/514* (2021.01)
*G01R 31/385* (2019.01)
*G01R 31/52* (2020.01)

(52) U.S. Cl.
CPC ......... *G01R 31/3865* (2019.01); *G01R 31/52* (2020.01); *H01M 50/514* (2021.01)

(58) Field of Classification Search
CPC .... G01R 31/3865; G01R 31/52; G01R 31/36; G01R 31/396; H01M 50/514; H01M 10/4285; H01M 10/48; H01M 10/482; Y02E 60/10
See application file for complete search history.

(56) References Cited

FOREIGN PATENT DOCUMENTS

| | | | |
|---|---|---|---|
| JP | 2010153275 A | * | 7/2010 |
| JP | 2013084508 A | * | 5/2013 |
| JP | 2014134395 A | * | 7/2014 |

* cited by examiner

*Primary Examiner* — Catherine T. Rastovski
*Assistant Examiner* — Emma Alexander
(74) *Attorney, Agent, or Firm* — HAUPTMAN HAM, LLP

(57) ABSTRACT

A method for inspecting a power storage device for short circuit includes: adjusting a plurality of power storage devices to a first device voltage; restraining the power storage devices; measuring a pre-leaving device voltage, leaving the power storage devices, and measuring a post-leaving device voltage; obtaining a voltage drop rate; and determining whether or not a restrained device is short-circuited using a voltage drop rate. The method further includes: calculating a largest adjustment timing difference between an oldest adjustment completion time of an oldest adjusted device and a newest adjustment completion time of a newest adjusted device, after adjusting the voltage but before measuring the pre-leaving voltage; obtaining a shortest standby time from the largest adjustment timing difference; and deferring the measuring of the pre-leaving voltage until the shortest standby time elapses.

6 Claims, 8 Drawing Sheets

METHOD FOR INSPECTING A POWER STORAGE DEVICE FOR SHORT CIRCUIT AND METHOD FOR MANUFACTURING A CONNECTED RESTRAINED-DEVICE MODULE

CROSS-REFERENCE TO RELATED APPLICATIONS

This application is based upon and claims the benefit of priority to Japanese Patent Application No. 2022-150807 filed on Sep. 22, 2022, the entire contents of which are incorporated herein by reference.

BACKGROUND

Technical Field

The present disclosure relates to a method for inspecting a power storage device for short circuit and a method for manufacturing a connected restrained-device module.

Related Art

In manufacturing power storage devices such as secondary batteries, a short-circuit test is conventionally performed. For example, Japanese unexamined patent application publication No. 2014-134395 discloses a method for inspecting a secondary battery for short circuit, the method including an SOC adjusting step of adjusting a value of SOC by discharging the secondary battery (also simply referred as a battery) that has been initially charged and a self-discharging step of making self-discharge of the battery having the adjusted SOC, that is, the battery adjusted to a predetermined battery voltage, by leaving the battery to stand, in which it is determined whether or not the battery is short-circuited based on a voltage drop amount of the battery in the self-discharging step. This is because a battery with a short circuit decreases with a larger voltage drop amount than a battery without a short circuit during the same period in the self-discharge step.

SUMMARY

Technical Problems

When batteries having been charged for the first time, i.e., initially-charged batteries, are adjusted to a predetermined battery voltage and then left to stand, the battery voltage more largely drops in a short-circuited battery than in a battery having no short circuit (namely, a non-short-circuited battery) during the same period, as described above. This is because electric charges stored in the short-circuited battery are discharged through a short-circuit portion of this battery. In this case, assuming that a resistance value of the short-circuit portion does not change, the battery is generally discharged at a constant current, and the battery voltage of the short-circuited battery will generally drop at a constant rate, except when the SOC of the battery is low, for example, when the SOC is 10% or less.

However, when the initially-charged battery is adjusted to the predetermined battery voltage and then left to stand, a possible battery voltage drop is caused not only due to a short circuit as described above. Specifically, a (non-defective) battery that is not short-circuited is charged for the first time. This battery is then adjusted to a predetermined battery voltage, and further left to stand. In this case, the battery voltage will drop at a relatively large rate immediately after being adjusted to the predetermined battery voltage. However, the battery voltage will behave to drop slowly over time and finally approach a generally constant battery voltage value. This is conceivably because SEI coating formation on the surfaces of active material particles by reaction between those particles and an electrolyte slows down with time, and the battery voltage drop caused by such coating formation converges. In other words, the magnitude of battery voltage drop that occurs during the short circuit inspection varies depending on the length of an elapsed time from when the battery having been initially charged is completely adjusted to the predetermined battery voltage until the short circuit inspection is started.

In some cases, the presence/absence of the short circuit is inspected on a plurality of batteries that are directly stacked or indirectly stacked through spacers or the like, and restrained by a restraining member to constitute a restrained-battery module, such as non-connected battery stack, while the batteries are compressed in a battery stacking direction but are not connected to each other, this restrained-battery module is left to stand at a room temperature, and then it is detected whether or not each restrained battery is short-circuited based on the voltage drop amounts of each battery before and after leaving. In this case, restrained-battery modules may be different in the history of temperature change on each battery included in each restrained-battery module, and the battery voltage in each battery may drop with different behavior among the battery modules.

Therefore, there is an occasion where it is determined whether or not each battery is short-circuited by examining and using the voltage drop amounts and the voltage drop rates, which correspond to the inclinations thereof, of the battery voltages of a group of batteries included in the same, or the single, restrained-battery module which are considered to have almost the same temperature change history. For example, firstly, average values or median values of the obtained voltage drop amounts and voltage drop rates are used as reference values. Predetermined values are added to those reference values to obtain a threshold drop amount and a threshold drop rate. Thus, a battery having a voltage drop amount exceeding the threshold drop amount and a battery having a voltage drop rate exceeding the threshold drop rate are determined to have a short circuit and removed. In many cases, the foregoing restrained-battery module is constituted of the batteries having the same or almost the same elapsed time from the initial charge until the adjustment to the predetermined battery voltage; for example, the batteries belonging to the same processing lot.

However, the restrained-battery module may contain different types of batteries, e.g., a battery(s) having a long elapsed time from the initial charge until the adjustment to the predetermined battery voltage, that is, an old battery(s) adjusted to the predetermined battery voltage at an earlier time, and a new battery(s) having a short elapsed time from the initial charge until the adjustment to the predetermined battery voltage, that is, a battery(s) adjusted to the predetermined battery voltage at a relatively latest time. For example, such a mixture of different types of batteries in constituting one restrained-battery module may occur when the number of batteries in one processing lot is excessive and the excess batteries of different processing lots are combined together to constitute a single restrained-battery module, or, when the timing of battery manufacturing process and the timing of voltage adjusting process are disrupted due to long consecutive holidays, accidents such as power failures or outages. When the restrained-battery module is made up from a mixture of the old battery(s) and the new battery(s), even if none of the batteries is short-circuited, the voltage drop amount and the voltage drop rate of the new battery(s) are larger than those of the old battery(s), which may result in determination failure.

The present disclosure has been made to address the above problems and has a purpose to provide a method for inspecting a power storage device for short circuit, capable of appropriately determining whether or not a short circuit exists, regardless of the length of an elapsed time from when the power storage device is initially charged and then adjusted to a predetermined device voltage, and a method for manufacturing a connected restrained-device module using this inspection method.

Means of Solving the Problems (1) To achieve the above-described purpose, one aspect of the present disclosure provides a method for inspecting a power storage device for short circuit, the method comprising: adjusting a voltage of a power storage device, which has been initially charged, to a first device voltage by charging or discharging the power storage device, restraining a plurality of the power storage devices each having been adjusted to the first device voltage by a restraining member while the power storage devices are unconnected to each other, to constitute a restrained-device module including a plurality of restrained devices which are the power storage devices under restraint, measuring a pre-leaving device voltage of each of the restrained devices included in a single restrained-device module; leaving the restrained-device module that has been measured for the pre-leaving device voltage; measuring a post-leaving device voltage of each of the restrained devices included in the single restrained-device module after leaving the restrained-device module; obtaining a voltage drop rate based on the pre-leaving device voltage and the post-leaving device voltage for each of the restrained devices; determining whether or not each of the restrained devices included in the single restrained-device module is short-circuited by use of the voltage drop rate of each of the restrained devices included in this restrained-device module, which are obtained in obtaining the voltage drop rate; after adjusting the voltage of a power storage device but before measuring the pre-leaving voltage, calculating a largest adjustment timing difference that is a time difference between an oldest adjustment completion time of an oldest adjusted device that is completely adjusted to the first device voltage at an adjustment completion time that is oldest and a newest adjustment completion time of a newest adjusted device that is completely adjusted to the first device voltage at an adjustment completion time that is newest from among the restrained devices included in the single restrained-device module; obtaining either a shortest standby time or an earliest start timing that allows start of measuring the pre-leaving voltage, from the largest adjustment timing difference, based on a predetermined standby time function for obtaining the shortest standby time after the newest adjustment completion time until the start of measuring the pre-leaving voltage is allowed, in which the shortest standby time is obtained longer as the largest adjustment timing difference is larger; and deferring measurement of the pre-leaving voltage until the shortest standby time elapses or until the earliest start timing is reached.

In this short circuit inspecting method for the power storage device, after the voltage adjusting process but before the pre-leaving voltage measuring process, the calculating process is performed to calculate the largest adjustment timing difference between the oldest adjustment completion time of the oldest adjusted device that is adjusted at the oldest, or earliest, timing and the newest adjustment completion time of the newest adjusted device that is adjusted at the newest, or latest, timing among the plural restrained devices included in the single, or the same, restrained-device module. In the obtaining process, subsequently, the shortest standby time or the earliest start timing is obtained from the largest adjustment timing difference obtained in the calculating process based on the standby time function. Furthermore, in the deferring process, the pre-leaving voltage measuring process is deferred until the shortest standby time elapses or until the earliest start timing is reached.

Accordingly, in the short circuit inspecting method for the power storage device, when the adjustment completion times of the plural restrained devices included in the restrained-device module are the same or almost the same timing, it is possible to quickly start the pre-leaving voltage measuring process without deferring or with shortly deferring regardless of whether the adjustment completion time is earlier (old) or later (new), and perform the short circuit inspection to appropriately determine whether or not a short circuit exists. On the other hand, even when the adjustment completion times are not the same timing, the pre-leaving voltage measuring process is postponed according to the largest adjustment timing difference. This makes it possible to appropriately determine whether or not each power storage device is short-circuited, from the oldest adjusted device to the newest adjusted device, regardless of the timing of the adjustment completion time, that is, regardless of the length of an elapsed time from when each device is completely adjusted.

The "power storage device" and the "restrained device" which is the restrained power storage device may include for example a secondary battery such as a lithium-ion secondary battery, a capacitor such as a lithium-ion capacitor, and others. The "restrained-device module" may be any restrained unit in which a plurality of power storage devices are restrained together or individually in a predetermined direction using a restraining member. For example, it may include a device stack such as a battery stack in which a plurality of power storage devices, such as secondary batteries, are stacked in a row in a stacking direction.

In constituting the restrained-device module including restrained devices by restraining a plurality of power storage devices adjusted to the first device voltage, the power storage devices may be restrained promptly after being adjusted to the first device voltage to constitute the restrained-device module. Furthermore, in constituting the restrained-device module, the power storage devices may be left to stand in an unrestrained condition (including a weakly restrained condition to the extent that does not allow the power storage devices to move even when subjected to vibrations or shocks during delivery) for an appropriate period, and a power storage device(s) in the unrestrained state determined to have a short circuit is removed and then the restrained-device module is constituted.

The oldest adjustment completion time and the newest adjustment completion time may be concretely set to a specific date, which is expressed by mm/dd (month/date), or a specific date and time, which is expressed by mm/dd/hh (month/date/hour). The largest adjustment timing difference is a timing difference between the oldest adjustment completion time and the newest adjustment completion time; concretely, it is set as the length of time, such as 3 days or 50 hours. The shortest standby time is set as the shortest period from the newest adjustment completion time (e.g., mm/dd/hh (month/date/hour)) until the pre-leaving voltage measuring is allowed to start, concretely, the length of time, such as 10 days or 98 hours. Further, the earliest start timing is given as the earliest date and time (e.g., mm/dd/hh (month/date/hour)) at which the pre-leaving voltage measuring process is enabled to start.

In the obtaining process, in obtaining the concrete magnitude of the shortest standby time and the concrete date and time of the earliest start timing based on the standby time function, the shortest standby time and the earliest start timing may be acquired using the standby time function itself or a graph or table crated based on the standby time function.

(2) In the method for inspecting s a power storage device for short circuit in (1), the shortest standby time is a shortest elapsed time predicted such that a predicted drop rate difference falls below a predetermined upper-limit drop rate difference, the predicted drop rate difference being obtained by subtracting a second predicted drop rate corresponding to the voltage drop rate predicted to occur in the oldest adjusted device from a first predicted drop rate corresponding to the voltage drop rate predicted to occur in the newest adjusted device.

In this short circuit inspecting method for a power storage device, the shortest elapsed time during which the predicted drop rate difference is expected to fall below a predetermined upper-limit drop rate difference is used as the shortest standby time obtained by the standby time function, so that the standby time function can be easily obtained.

(3) Another aspect of the present disclosure provides a method for manufacturing a connected restrained-device module, the method comprising: inspecting whether or not each of the restrained devices included in the single restrained-device module is short-circuited by the method for inspecting a power storage device for short circuit according to (1) or (2); and connecting the restrained devices included in the restrained-device module to each other when all of the restrained devices included in the restrained-device module are determined not to be short-circuited.

In the above-described manufacturing method for a connected restrained-device module, each of the restrained devices included together in the single, or same, restrained-device module is inspected for a short circuit in the short circuit inspecting process. Then, for the restrained-device module determined that all of the included restrained device are not short-circuited, those restrained devices are connected to each other in the connecting process. In this manner, for only the restrained-device module consisting of the restrained devices that are determined not to be short-circuited, these restrained devices are connected to each other to easily manufacture a connected restrained-device module.

The method of connecting the restrained devices (i.e., the power storage devices) may be selected according to the structure of connection terminals of the power storage devices, or the like. For example, this connecting method may be performed using bus bars. Further, the power storage devices may be electrically connected in series or in parallel.

(4) In the method for manufacturing a connected restrained-device module described in (3), the restrained-device module comprises a plurality of restrained-device modules, and the method further comprises: removing at least one restrained device having been determined to be short-circuited in inspecting the short circuit from among the restrained devices included in the same restrained-device module of the restrained-device modules; and re-restraining the remaining restrained devices that are determined not to be short-circuited in inspecting the short circuit together with a supplementary power storage device that is prepared in advance to reconstitute the re-restrained-device module, the supplementary power storage device having been included in another restrained-device module of the restrained-device modules and determined not to be short-circuited in inspecting the short circuit.

In the above manufacturing method for a connected restrained-device module, the power storage device(s) determined to be short-circuited is removed in the removing process, while remaining power storage device(s) not short-circuited and a supplementary power storage device(s) that is included in another one of the plural restrained-device modules and determined not to be short-circuited are combined to reconstitute the restrained-device module in the re-restraining process. Consequently, even if the short-circuited power storage device(s) is included in the restrained devices, the restrained-device module can be easily reconstituted to manufacture the connected restrained-device module.

DETAILED DESCRIPTION OF THE EXEMPLARY EMBODIMENTS

Figure 1:
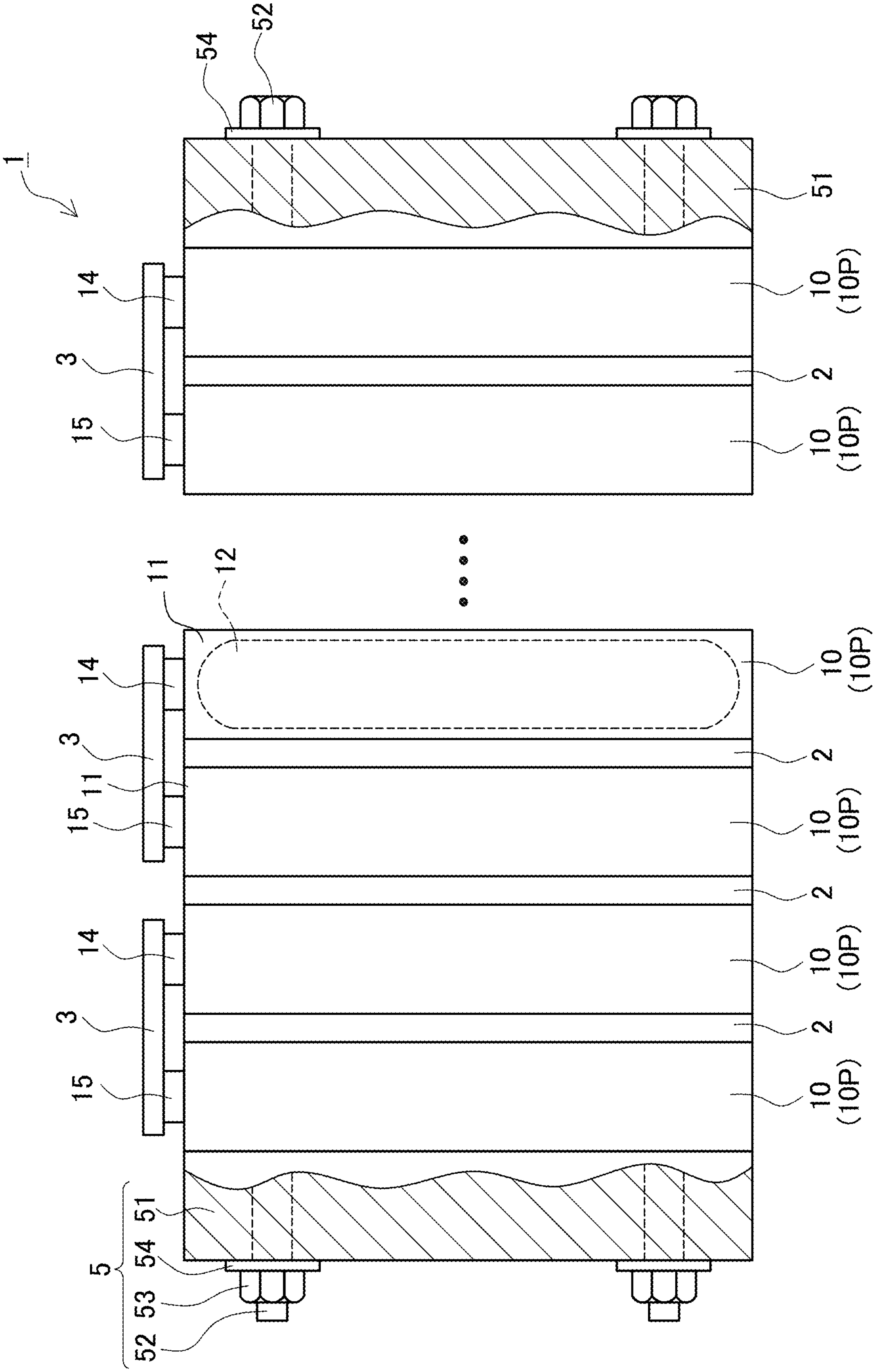
FIG. 1 is an explanatory diagram of a battery stack in an embodiment.

A detailed description of a battery stack 1 in an embodiment of this disclosure will now be given referring to the accompanying drawings. FIG. 1 shows the battery stack 1 in which a plurality of (e.g., twenty-eight) batteries 10 each having a rectangular parallelepiped box shape are stacked and restrained into a fixed dimension by restraining members 5. The battery stack 1 is one example of a connected restrained-device module and each battery 10 is one example of a power storage device in the present disclosure. In this battery stack 1, the batteries 10 are stacked in the stacking direction SH, i.e., the horizontal direction in FIG. 1, with spacers 2 interposed therebetween, and the batteries 10 are restrained under pressure by the restraining members 5 in the stacking direction SH. Specifically, a plurality of restrained batteries 10P, which are lithium-ion secondary batteries in the present embodiment, and the spacers 2 are alternately stacked and held between a pair of restraining plates 51. These restrained batteries 10P are further pressed and restrained in the stacking direction SH by use of restraining bolts 52 extending in the stacking direction SH and bridging between the restraining plates 51, and nuts 53 screwed on the bolts 52 through washers 54. A positive terminal 14 and a negative terminal 15 (mentioned later) of each restrained battery 10P are connected to those of adjacent restrained batteries 10P through bus bars 3. In the battery stack 1 in the present embodiment, as shown in FIG. 1, the restrained batteries 10P are arranged to be alternately reversed so that the positive terminals 14 and the negative terminals 15 are alternately aligned in a row in the stacking direction SH. By linking through the bus bars 3, the restrained batteries 10P are connected in series. The battery stack 1 is used for example in vehicles, such as a hybrid car, a plug-in hybrid car, and an electric car.

The batteries 10 used in this battery stack 1 are sealed lithium-ion secondary batteries each having a rectangular parallelepiped box shape. Each battery 10 includes a case 11 made of aluminum in a rectangular parallelepiped box shape, an electrode body 12 indicated by a broken line in one of the batteries 10 and accommodated in the case 11, the positive terminal 14 and the negative terminal 15 that are each connected to the electrode body 12 inside the case 11 and protrude out of the case 11, upward in FIG. 1.

Next, the manufacture of the battery stack 1 will be described below, referring to FIGS. 2 to 8. The batteries 10 which have not been charged yet (i.e., the uncharged batteries 10) are first produced. The manufacturing method for the sealed batteries 10 having the rectangular parallelepiped case 11 is well known and thus the details thereof are omitted herein. In an initial charging step S1 (see FIG. 3), the uncharged batteries 10 are charged initially, i.e., for the first time, up to 60% to 100% SOC by CCCV charging (a constant current of 1 to 10 C and a cut current of 0.1 to 1 C) under a room temperature. In the present embodiment, for example, the CCCV charging is performed with a constant current of 7 C, a cut voltage of 3.85 V (equivalent to 75% SOC), and a cut current of 0.3 C under an ambient temperature of 25° C. In a high-temperature aging step S2, a high-temperature aging treatment is performed by leaving each initially charged battery 10 to stand in an open state for 10 to 200 hours under an ambient temperature of 50° C. to 80° C.; for example, for 18 hours at 70° C. in the present embodiment. These batteries 10 are cooled and then a capacity inspecting step S3 is performed by charging the batteries 10 to 100% SOC and further discharging the same to 0% SOC to measure the capacity of each battery 10, concretely, the discharged capacity of each battery 10 in the above case.

Subsequently, the batteries 10 undergo a short-circuit inspecting and restraining step S4. In this step S4, a voltage adjusting step S41 is performed first in which each battery 10 is CCCV charged (a constant current of 1 to 10 C and a cut current of 0.1 to 1 C) to adjust the battery voltage VB of each battery 10 to a first voltage VB1 within a range of 30% to 100% SOC under a room temperature. In the present embodiment, the CCCV charging is performed, for example, under an ambient temperature of 25° C., with a constant current of 7 C, a cut voltage of 3.75 V (equivalent to 60% SOC) which is 0.1 V lower than the initial charge, and a cut current of 0.3 C. Specifically, the battery voltage VB of each battery 10 is adjusted once to the same first voltage VB1 (VB1=3.75 V in the present embodiment).

Subsequently, an individual short-circuit inspecting step S42 is performed to inspect the batteries 10 having undergone the voltage adjusting step S41, for short circuit in an individual state, i.e., without restraint. Specifically, this step S42 is intended to eliminate a defective battery(s) 10N that has been short-circuited from the batteries 10 in the individual state to prevent incorporation of such a defective battery(s) 10N as one(s) of the batteries 10 for constituting a stack of unconnected batteries, which will be referred to as an unconnected battery stack 1M (see FIG. 2), in a restraining step S43 mentioned later.

In this individual short-circuit inspecting step S42 (see FIG. 4), specifically, a pre-leaving measuring step S421 is performed first to measure a pre-leaving second voltage VB2*a*, which is the battery voltage VB of each battery 10 (see FIG. 6) before leaving. The battery voltage VB of each battery 10 is once equalized to the same first voltage VB1 by the CCCV charging as described above. However, immediately after the CCCV charging is terminated, the battery voltage VB decreases by that amount of voltage drop occurring in a battery resistance by a charged current during CV charging. In addition, even when the battery(s) 10 is not short-circuited, the battery voltage VB gradually decreases over time as described later (see FIG. 6). Therefore, the pre-leaving second voltage VB2*a* of each battery 10 after charged to the first voltage VB1 is measured prior to an individual leaving step S422 described below.

In the following individual leaving step S422, the batteries 10 with the positive terminals 14 and the negative terminals 15 in an open state are left in an unrestrained, or individual, condition for a leaving period which will be referred to as an individual leaving period IH (IH≥5.0 days (i.e., IH≥120 hours) in the present embodiment), at an ambient temperature of 25° C. Then, in a post-leaving measuring step S423, a post-leaving second voltage VB2*b*, which is the battery voltage VB of each battery 10 after leaving, is measured.

In the following drop rate obtaining step S424, for each battery 10, a second voltage drop rate DVB2, which is the drop amount of the battery voltage VB per unit time (e.g., per day or per hour), is calculated by dividing a difference voltage ΔVB2 between the pre-leaving second voltage VB2*a* and the post-leaving second voltage VB2*b* by an actual individual leaving period IH.

The length of the individual leaving period IH may vary because the timing at which the post-leaving measuring step S423 can be performed differs between lots in the individual leaving step S422 according to whether or not the individual leaving period IH includes a weekend, whether or not the post-leaving measuring step S423 is delayed, and other factors. Accordingly, in an individual short-circuit determining step S425 and others, which will be described below, it is easier to compare the voltage drop rate DVB2 with a determination criteria than to compare the difference voltage ΔVB2 between the pre-leaving second voltage VB2*a* and the post-leaving second voltage VB2*b* with the determination criteria.

In the individual short-circuit determining step S425, it is determined whether or not each battery 10 is short-circuited based on the second voltage drop rate DVB2 obtained for each battery 10. Specifically, it is determined whether or not the second voltage drop rate DVB2 is larger than a predetermined threshold drop rate THD2, i.e., whether DVB2>THD2. If YES in S425, the battery(s) 10 is determined to be short-circuited and is eliminated from the manufacturing process. In contrast, if NO in S425, that is, if the second voltage drop rate DVB2 is smaller than the threshold drop rate THD2, i.e., DVB2<THD2, the battery(s) 10 is determined not to be short-circuited, and the process advances to the next step, i.e., a restraining step S43. Thus, the individual short-circuit inspecting step S42 is terminated.

In the following restraining step S43 (see FIG. 3), the batteries 10 determined not to be short-circuited in the individual short-circuit inspecting step S42 (concretely, the individual short-circuit determining step S425) and the spacers 2 are assembled together by use of the restraining members 5 to constitute an unconnected battery stack 1M (see FIG. 2) by a well-known method. In this unconnected battery stack 1M, the batteries 10 are referred to as the restrained batteries 10P that are pressed and restrained in the stacking direction SH. Therefore, in the electrode body 12 of each restrained battery 10P, positive and negative electrode sheets or plates not shown are compressed with separators interposed between the restrained batteries 10P in the thickness direction corresponding to the stacking direction SH. However, unlike the battery stack 1 (see FIG. 1), no bus bar 3 is attached, and the positive terminals 14 and the negative terminals 15 are not connected between the adjacent restrained batteries 10P, so that each restrained battery 10P is in an open state. For this unconnected battery stack 1M, the restrained batteries 10P under restraint are individually subjected to short-circuit inspection. From this restraining step S43, a plurality of batteries 10P (e.g., twenty-eight batteries 10P in the present embodiment) included in a single, i.e., the same, unconnected battery stack 1M (or the battery stack 1) are treated as one group.

In the present embodiment, a calculating step S44, an obtaining step S45, and a deferring step S46 are performed following the restraining step S43, and then a restraint short-circuit inspecting step S47 is performed for short-circuit inspection on each restrained battery 10P under restraint, i.e., under compression, in the unconnected battery stack 1M to detect whether or not each restrained battery 10P is short-circuited. In the following description, for convenience of explanation, the restraint short-circuit inspecting step S47 will be described prior to the calculating step S44 to the deferring step S46.

In the restraint short-circuit inspecting step S47 (see FIG. 5), a pre-leaving voltage measuring step S471 is performed to measure a pre-leaving third voltage VB3*a*, which is the battery voltage VB of each restrained battery 10P included in a group of restrained batteries 10P forming the single unconnected battery stack 1M. Even when a restrained battery(s) 10P is not short-circuited, as described above, the battery voltage VB thereof decreases over time (see FIG. 6). Therefore, the pre-leaving third voltage VB3*a* of each restrained battery 10P is measured prior to the restraint leaving step S472 described below.

In the following restraint leaving step S472, the unconnected battery stack 1M, that is, the group of restrained batteries 10P restrained by the restraining members 5, with the positive terminals 14 and the negative terminals 15 in an open state, is left standstill under restraint condition for a leaving period PH which will be referred to as a restraint leaving period PH (PH≥5.0 days (i.e., PH≥120 hours)) in the present embodiment), at an ambient temperature of 25° C. Then, in a post-leaving voltage measuring step S473, a post-leaving third voltage VB3*b*, which is the battery voltage VB of each of the restrained batteries 10P belonging to the single unconnected battery stack 1M after leaving, is measured.

In the following voltage drop rate obtaining step S474, for a group of the restrained batteries 10P forming the single unconnected battery stack 1M, a third voltage drop amount ΔVB3, which is a difference voltage between the pre-leaving third voltage VB3*a* and the post-leaving third voltage VB3*b* of each restrained battery 10P, is calculated (ΔVB3=VB3*a*−VB3*b*).

Furthermore, the third voltage drop amount ΔVB3 of each of the restrained batteries 10P is divided by an actual restraint leaving period PH to calculate a third voltage drop rate DVB3, which is a third voltage drop amount per unit time, e.g., per day or per hour. The length of the restraint leaving period PH may slightly differ between the unconnected battery stacks 1M depending on whether or not the restraint leaving period PH includes a weekend, whether or not the post-leaving voltage measuring step S473 is delayed, and other factors. Therefore, in a restraint short-circuit determining step S475 and others mentioned below, it is easier to perform the following determination using the third voltage drop rate DVB3 than using the third voltage drop amount ΔVB3 itself.

In the restraint short-circuit determining step S475, using the third voltage drop rate DVB3 obtained for each of a group of the restrained batteries 10P belonging to the single unconnected battery stack 1M, it is determined whether or not each restrained battery 10P of the target unconnected battery stack 1M is a short-circuited and then it is comprehensively determined whether or not this unconnected battery stack 1M contains at least one defective battery 10N.

Specifically, an average drop rate ADVB3 is calculated first, which is an average value of the third voltage drop rates DVB3 of a group of the restrained batteries 10P (twenty-eight batteries in the present embodiment). Further, this average drop rate ADVB3 is used to determine whether or not the third voltage drop rate DVB3 of each restrained battery 10P is appropriate. To be specific, a threshold drop rate THD3 obtained by adding an allowable range PW3, which is given in advance, to the average drop rate ADVB3 (THD3=ADVB3+PW3), is compared with the third voltage drop rate DVB3 of each restrained battery 10P. When the third voltage drop rate DVB3 is larger than the threshold drop rate THD3 (DVB3>THD3), that is, when the decreasing degree of the battery voltage VB is sharper than the threshold drop rate THD3, the relevant restrained battery 10P is determined to be a defective battery 10N. This determination is performed for each of a group of the restrained batteries 10P (twenty-eight restrained batteries in the present embodiment).

Then, one or plural restrained batteries 10P determined to be a defective battery(s) 10N is eliminated from a group of the restrained batteries 10P of belonging to the single unconnected battery stack 1M, and further a new average drop rate ADVB3 is calculated using only remaining restrained batteries 10P of the group. A new threshold drop rate THD3 obtained by adding the allowable range PW3 to the new average drop rate ADVB3 is compared again with the third voltage drop rate DVB3 of each restrained battery 10P. When the third voltage drop rate DVB3 is larger than the new threshold drop rate THD3 (DVB3>THD3), the relevant restrained battery 10P is also newly determined to be a defective battery 10N. This process is repeated until no defective battery 10N is newly found.

Furthermore, in the restraint short-circuit determining step S475, it is determined whether or not a group of the restrained batteries 10P belonging to the single unconnected battery stack 1M include a defective battery(s) 10N. If YES in S475, that is, if the unconnected battery stack 1M includes a defective battery(s) 10N, this unconnected battery stack 1M is shifted to a removing step S6 mentioned later. In contrast, if NO in S475, that is, if the unconnected battery stack 1M includes no defective battery 10N, this unconnected battery stack 1M is shifted to a connecting step S5.

The above-described example of the restraint short-circuit determining step S475 shows that the threshold drop rate THD3 is obtained using the average drop rate ADVB3 of the third voltage drop rates DVB3 of the group of restrained batteries 10P. As an alternative, it may be determined whether or not there is a defective battery 10N by obtaining the threshold drop rate THD3 by adding the allowable range PW3 to a median drop rate MDVB3 which is the median of the third voltage drop rates DVB3, instead of the average drop rate ADVB3.

In the connecting step S5, the positive terminals 14 and the negative terminals 15 of a group of the restrained batteries 10P forming the unconnected battery stack 1M are connected with the bus bars 3 to interconnect the restrained batteries 10P, thus completing the battery stack 1 (see FIG. 1). In this manner, for only the unconnected battery stack 1M constituted of the restrained batteries 10P which are all determined not to be short-circuited, those restrained batteries 10P are connected to each other to easily manufacture a connected battery stack 1.

On the other hand, in the removing step S6, the defective battery(s) 10N is removed from the unconnected battery stack 1M including at least one defective battery 10N. Specifically, the restraining bolts 52 and the nuts 53 of the restraining members 5 are unfastened, and the defective battery(s) 10N are removed from the unconnected battery stack 1M and eliminated from the manufacturing process.

In the following re-restraining step S7, the unconnected battery stack 1M from which the defective battery(s) 10N has been removed is supplied with as many supplementary batteries 10H as the removed battery(s) 10N. Then, a group of the unremoved restrained battery(s) 10P and the supplementary battery(s) 10H is restrained again using the restraining members 5 to reconstitute the unconnected battery stack 1M (see FIG. 2). The supplementary battery 10H is a battery 10 that has been prepared in advance for supplemental use, which was included in another unconnected battery stack 1M (i.e., a different one of the plural unconnected battery stacks 1M) and already determined not to be short-circuited in the restraint short-circuit inspecting step S47. Then, this reconstituted unconnected battery stack 1M is subjected again to the restraint short-circuit inspecting step S47, and repeatedly reconstituted by supplementing a supplementary battery(s) 10H until no defective battery 10N is generated. In the restraint short-circuit determining step S475, if no defective battery 10N is included in the reconstituted unconnected battery stack 1M, this battery stack 1M is shifted to the connecting step S5 as described above.

In the connecting step S5, the bus bars 3 are connected to the positive terminals 14 and the negative terminals 15 of the group of the restrained batteries 10P forming the reconstituted unconnected battery stack 1M to interconnect the restrained batteries 10P, completing the battery stack 1 (see FIG. 1). Thus, even when the short-circuited battery(s) 10 is included in the unconnected battery stack 1M, it is possible to easily reconstitute the unconnected battery stack 1M to manufacture the battery stack 1.

As described above, regardless of the result of determination in the restraint short-circuit determining step S475 of the restraint short-circuit inspecting step S47, that is, regardless of whether it is determined that the unconnected battery stack 1M does not include any defective battery 10N (NO in S475) or includes a defective battery(s) 10N (YES in S475), the battery stack 1 can be completed.

Figure 3:
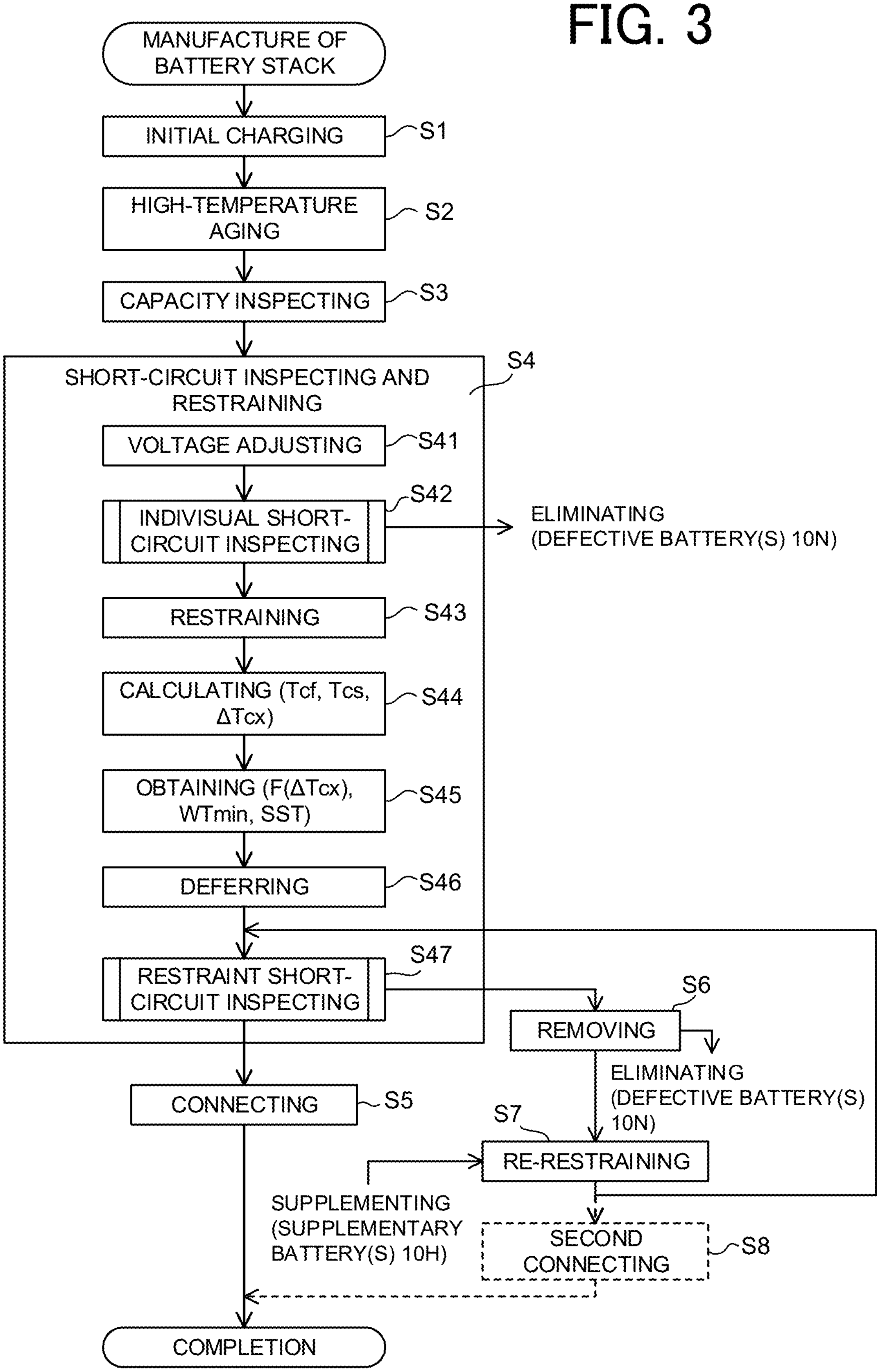
FIG. 3 is a flowchart showing a manufacturing process of the battery stack in the embodiment.
Figure 4:
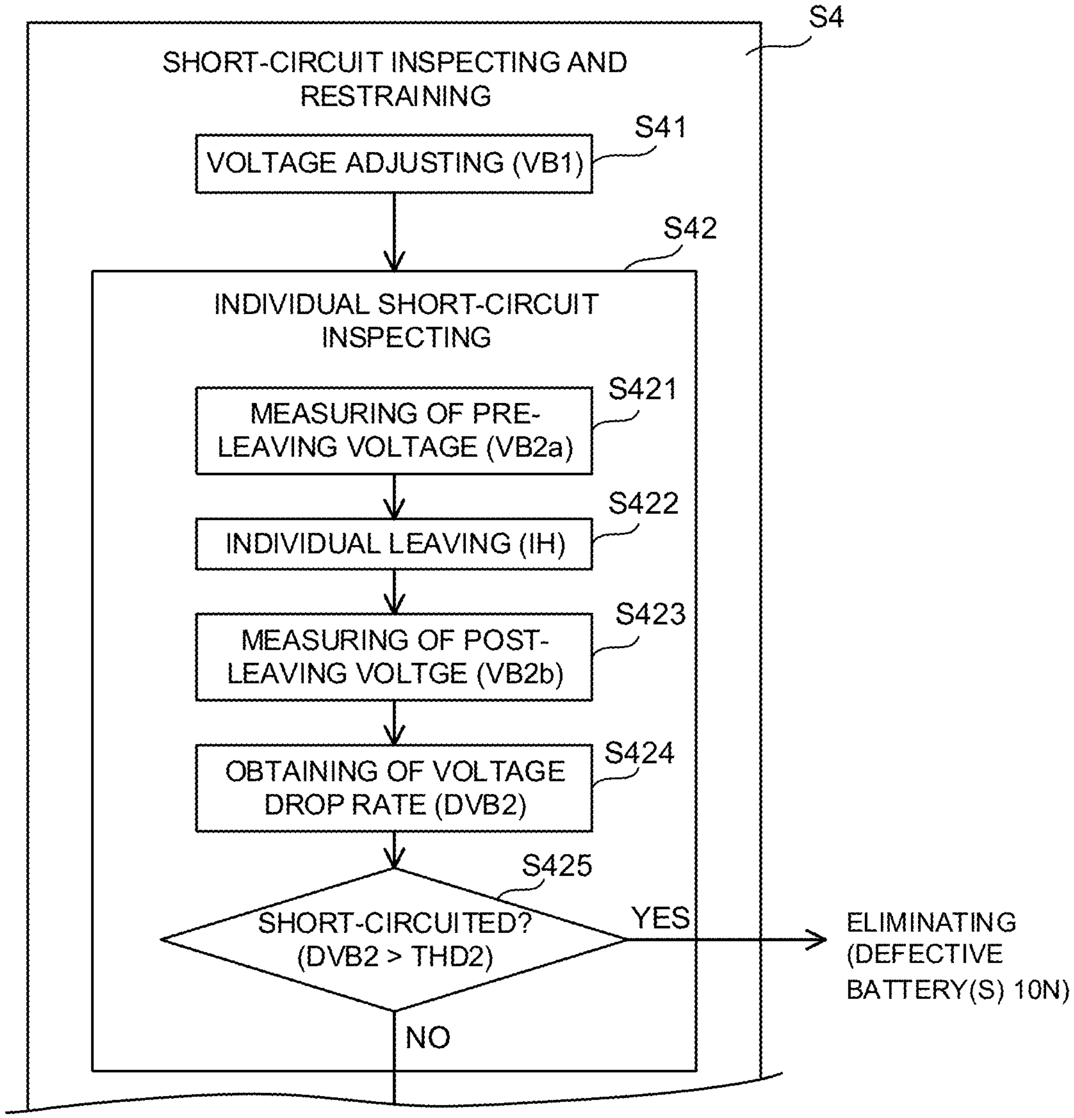
FIG. 4 is a flowchart showing the details of an individual short circuit inspecting step of the manufacturing process of the battery stack in the embodiment.
Figure 5:
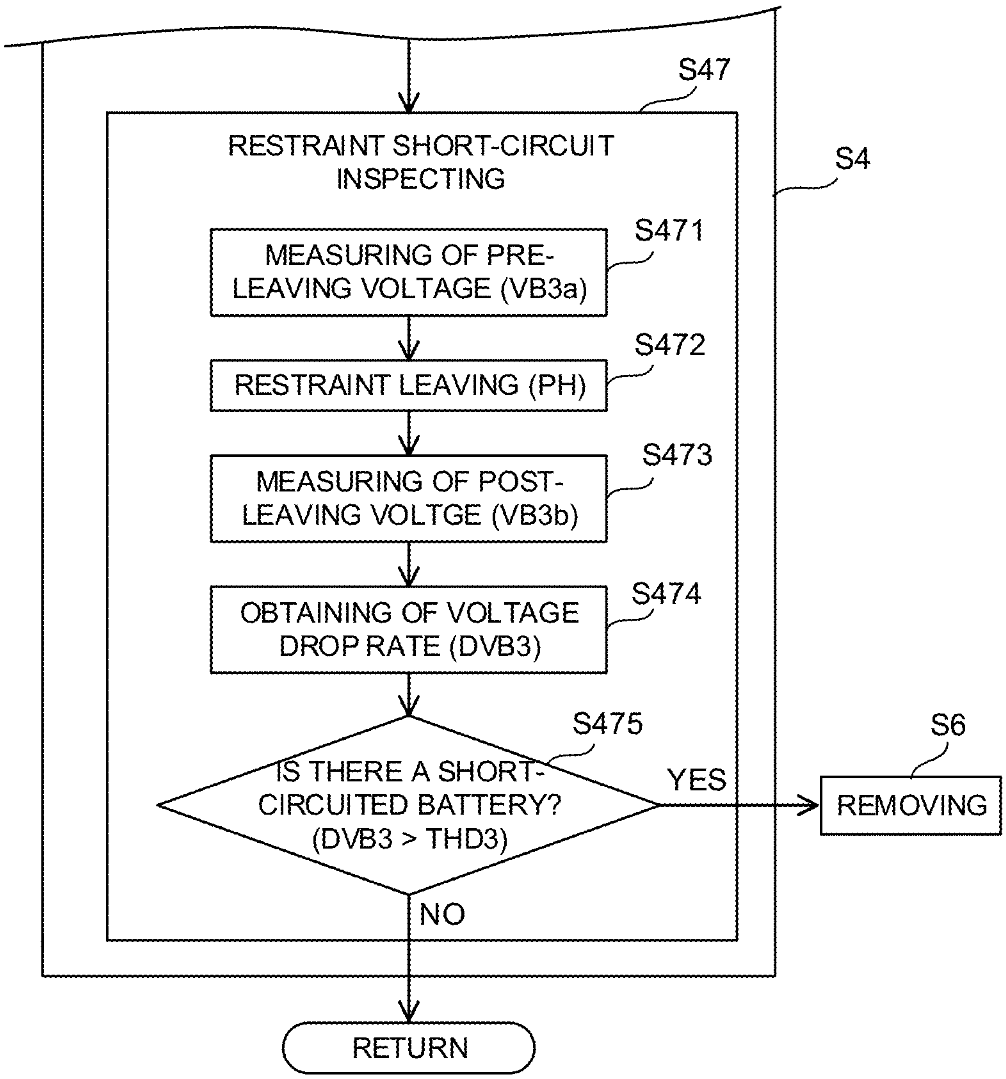
FIG. 5 is a flowchart showing the details of a restraint short-circuit inspecting step of the manufacturing process of the battery stack in the embodiment.

If there is a low probability that any more defective battery(s) 10N occurs in the unconnected battery stack 1M reconstituted by re-restraining in the re-restraining step S7, a second connecting step S8 may be performed following the re-restraining step S7, as indicated by a broken line in FIG. 3, by connecting the bus bars 3 to the positive terminals 14 and the negative terminals 15 of the group of the restrained batteries 10P of the reconstituted unconnected battery stack 1M to interconnect the restrained batteries 10P, completing the battery stack 1 (see FIG. 1). This can more easily reconstitute the unconnected battery stack 1M to manufacture the battery stack 1.

As described above, when the battery voltage VB of each battery 10 is adjusted to the first voltage VB1 by the CCCV charging in the voltage adjusting step S41 (this timing is hereinafter assumed as an adjustment completion time Tc), if the battery(s) 10 is not short-circuited since the adjustment completion time Tc, for example, the battery voltage VB of the battery 10 decreases as an elapsed time KT increases as shown in the graph in FIG. 6. In other words, when the CCCV charging is terminated, the battery voltage VB quickly drops just before the end of CV charging by the amount of voltage drop that has been generated by the battery resistance due to supply of a cutoff current (e.g., 0.3 C) to the battery 10. Furthermore, the battery voltage VB drops significantly (e.g., about 0.003 V=3 mV in FIG. 6) from immediately after the adjustment completion time Tc until about several hours to one day elapses, and then further decreases gradually. However, the battery voltage VB decreases gradually and slowly, and stabilizes over several hundred days. In other words, the battery voltage VB continues to drop even after a lapse of several days from the adjustment completion time Tc at which the battery voltage VB is adjusted to the first voltage VB1. However, as the elapsed time KT increases, the battery voltage VB decreases slowly, not linearly, as plotted in a downward curve in FIG. 6.

Figure 6:
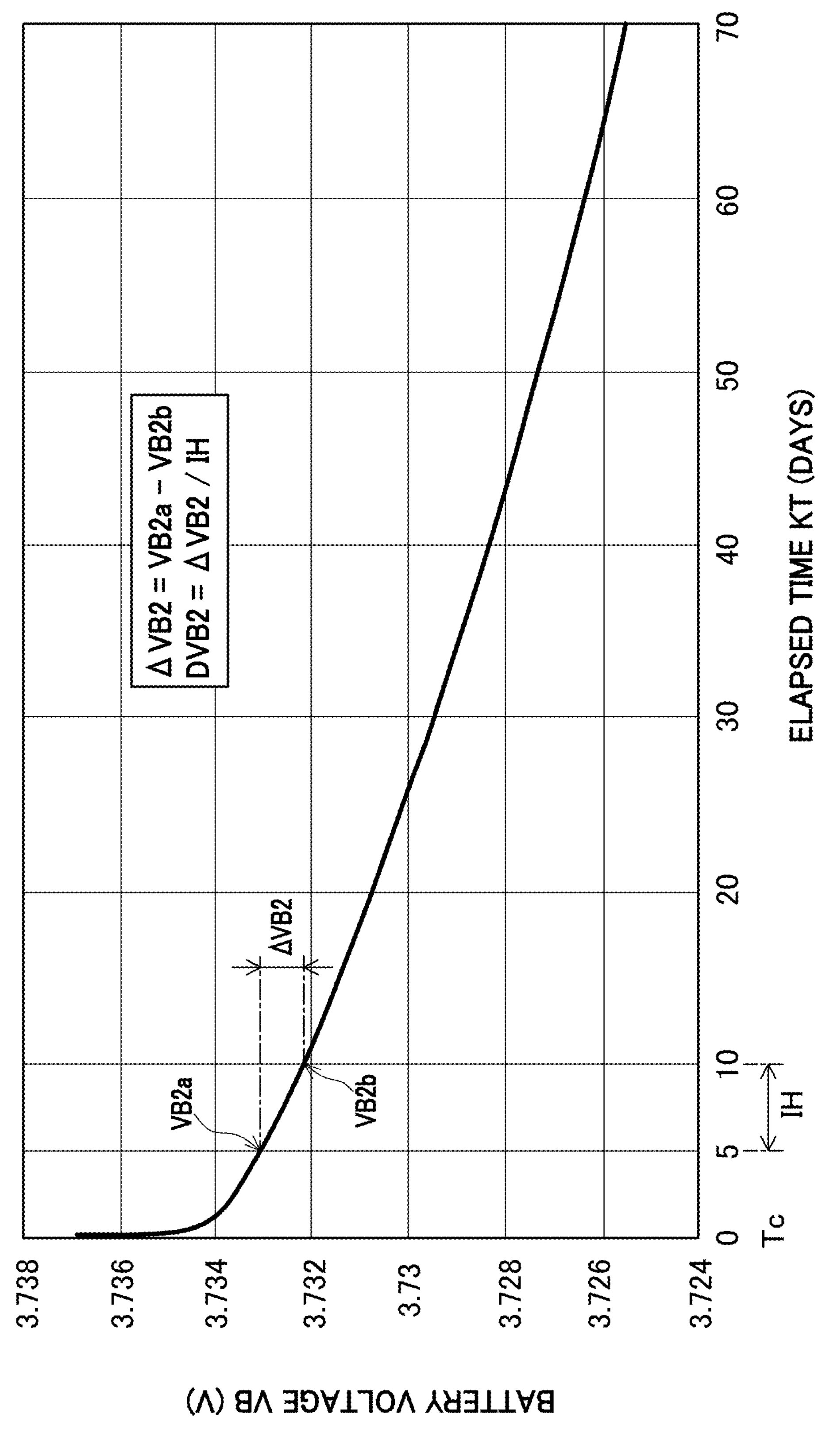
FIG. 6 is a graph showing an example of variations of battery voltage of a battery that is not short-circuited after an adjusting step in the embodiment.

When a battery 10 is not short-circuited, the battery voltage VB of the battery 10 transitions as graphed in FIG. 6, which is basically the same in either case where the battery 10 is not restrained (for example, during the individual leaving period IH in the individual leaving step S422, but including a weakly restrained condition to the extent that the battery 10 is not allowed to move even when subjected to vibrations or shocks during delivery) or where the battery 10 is restrained (for example, during the restraint leaving period PH in the restraint leaving step S472).

The battery voltage VB of each of the batteries 10 starts to drop as shown in FIG. 6 from the adjustment completion time Tc depending on each battery 10. Therefore, even if the individual leaving period IH and the restraint leaving period PH are equal in length among the batteries 10, the third voltage drop amount ΔVB3 and the voltage drop rates DVB2 and DVB3, which are generated before and after each of the periods IH and PH, will differ in magnitude among the batteries 10 depending on the elapsed time KT from the adjustment completion time Tc of the battery voltage VB in the voltage adjusting step S41.

However, in the individual short-circuit inspecting step S42 of the short-circuit inspecting and restraining step S4, the presence/absence of a short circuit can be determined for each battery 10 in the individual short-circuit determining step S425. Accordingly, even when the batteries 10 differ from each other in the elapsed time KT, it is only necessary to use the threshold drop rate THD2 set in consideration of a difference in elapsed time KT or use different threshold drop rates THD2 according to a difference in elapsed time KT. This can avoid any influence on the result of determination about whether or not a short circuit exists.

In contrast, in the restraint short-circuit inspecting step S47 performed at a later stage of the short-circuit inspecting and restraining step S4, the restrained batteries 10P are processed for each unconnected battery stack 1M. In the restraint short-circuit determining step S475, as described above, for a group of restrained batteries 10P belonging to a single unconnected battery stack 1M, the third voltage drop rate DVB3 of each restrained battery 10P is obtained and compared with the average drop rate ADVB3 (or alternatively the median drop rate MDVB3) to determine whether or not each restrained battery 10P is short-circuited. Therefore, if the restrained batteries 10P of the group belonging to the single unconnected battery stack 1M have different adjustment completion times Tc, it may affect the result of determination on the presence/absence of a short circuit. One example of this case is that, among a group of the restrained batteries 10P, a large number of restrained batteries 10P have long elapsed times KT from the adjustment completion times Tc and small third voltage drop rates DVB3, whereas one or a small number of restrained batteries 10P have a short elapsed time KT from the adjustment completion time Tc and a large third voltage drop rate DVB3.

Figure 7:
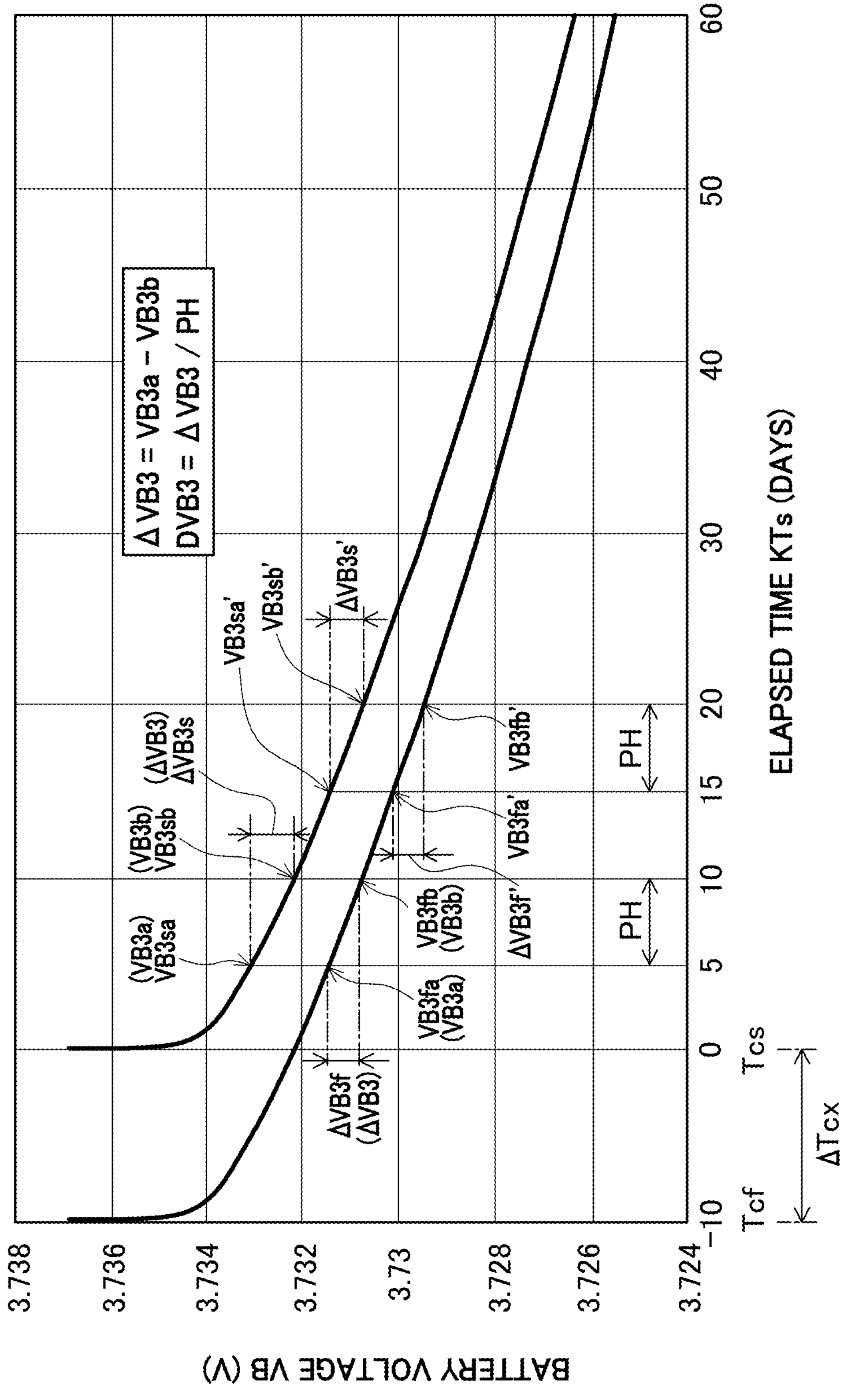
FIG. 7 is a graph showing a largest adjustment timing difference between an oldest restrained battery and a newest restrained battery and a relationship between an elapsed time and voltage drop rates of those batteries, utilizing the graph of FIG. 6.

The above case will be concretely described in a simplified example referring to FIG. 7. Considering a group of restrained batteries 10P (e.g., twenty-eight restrained batteries 10P) belonging to a certain unconnected battery stack 1M, which are formed in the restraining step S43, it is assumed that the adjustment completion time Tc of each of twenty-seven restrained batteries 10P (hereinafter, also referred to as old restrained batteries 10P) is equal to an oldest adjustment completion time Tcf. In contrast, it is assumed that the adjustment completion time Tc of one remaining restrained battery 10P (hereinafter, also referred to as a new restrained battery 10P) is a newest adjustment completion time Tcs which is just 10 days later than the oldest adjustment completion time Tcf of the twenty-seven restrained batteries 10P. If none of those twenty-eight restrained batteries 10P is short-circuited, the transition of the battery voltage VB of each restrained battery 10P (from before restraint in the restraining step S43) is generally as plotted by two graph lines in the graph of FIG. 7. In this graph of FIG. 7, a left graph line represents variations of the (typical) battery voltage VB of the twenty-seven restrained batteries 10P, while a right graph line in FIG. 7 represents variations of the battery voltage VB of the one, new restrained battery 10P. As is easily understood from FIG. 7, the larger the elapsed time KTs, the smaller a difference in battery voltage VB between the two graph lines. In FIG. 7, the horizontal axis indicates the elapsed times KTs starting from the newest adjustment completion time Tcs.

Herein, the pre-leaving voltage measuring step S471 of the restraint short-circuit inspecting step S47 is performed after a lapse of 15.0 days from the oldest adjustment completion time Tcf of the twenty-seven old restrained batteries 10P and 5.0 days from the newest adjustment completion time Tcs of the one new restrained battery 10P to measure the pre-leaving third voltage VB3*a* (VB3*fa*, VB3*sa*) of each restrained battery 10P. Further, the restraint leaving step S472 is performed with the restraint leaving period PH of 5 days, and the post-leaving voltage measuring step S473 is performed after a lapse of 5.0 days from the end of the pre-leaving voltage measuring step S471 to measure the post-leaving third voltage VB3*b* (VB3*fb*, VB3*sb*) of each restrained battery 10P. In the voltage drop rate obtaining step S474, the third voltage drop rate DVB3 of each of the twenty-eight restrained batteries 10P is obtained.

A third voltage drop amount ΔVB3*f* and a third voltage drop rate DVB3*f* calculated therefrom of each of twenty-seven restrained batteries 10P, which are plotted by the left graph line in FIG. 7, become approximate values to each other between the restrained batteries 10P and relatively small values. In contrast, a third voltage drop amount ΔVB3*s* and a third voltage drop rate DVB3*s* calculated therefrom of the one new restrained battery 10P, which is plotted by the right graph line in FIG. 7, become relatively larger values than the third voltage drop amount ΔVB3*f* and the third voltage drop rate DVB3*f* of the old restrained batteries 10P (see FIG. 7).

Therefore, as described above, when the average drop rate ADVB3 is calculated from the twenty-eight third voltage drop rates DVB3 in the restraint short-circuit determining step S475, the threshold drop rate THD3 is obtained by adding the allowable range PW3 to the average drop rate ADVB3 (THD3=ADVB3+PW3), and this threshold drop rate THD3 is compared with the third voltage drop rate DVB3 of each restrained battery 10P, the twenty-seven old restrained batteries 10P are determined not to be defective batteries 10N. This is because the third voltage drop rate DVB3*f* of each old restrained battery 10P approximates the average drop rate ADVB3. However, the third voltage drop rate DVB3*s* of the one new restrained battery 10P is larger than the threshold drop rate THD3 (DVB3*s*>THD3), and thus this new restrained battery 10P may be erroneously determined to be a defective battery 10N.

In the restraining step S43, in constituting the unconnected battery stack 1M from a group of (e.g., twenty-eight) batteries 10 (restrained batteries 10P) as described above, a restrained battery(s) 10P whose adjustment completion time Tc greatly differs from others may be included. For example, this mixture of the restrained battery(s) 10P may occur when the number of batteries belonging to the same processing lot is excessive and the excess batteries of different processing lots are combined together to constitute a single unconnected battery stack 1M, or, when the timing of battery manufacturing process and the timing of voltage adjusting process are disrupted due to for example long consecutive holidays, accidents such as power failures or outages.

In order to prevent the above-mentioned defects from occurring in the unconnected battery stack 1M including the restrained batteries 10P greatly different from each other in the adjustment completion time Tc, it is preferable to increase the elapsed time KT from the adjustment completion time Tc for each of the restrained batteries 10P belonging to the relevant unconnected battery stack 1M. In the present embodiment, therefore, the calculating step S44 to the deferring step S46 are performed after the voltage adjusting step S41 but before the pre-leaving voltage measuring step S471, concretely, after the restraining step S43 but before the pre-leaving voltage measuring step S471.

Figure 2:
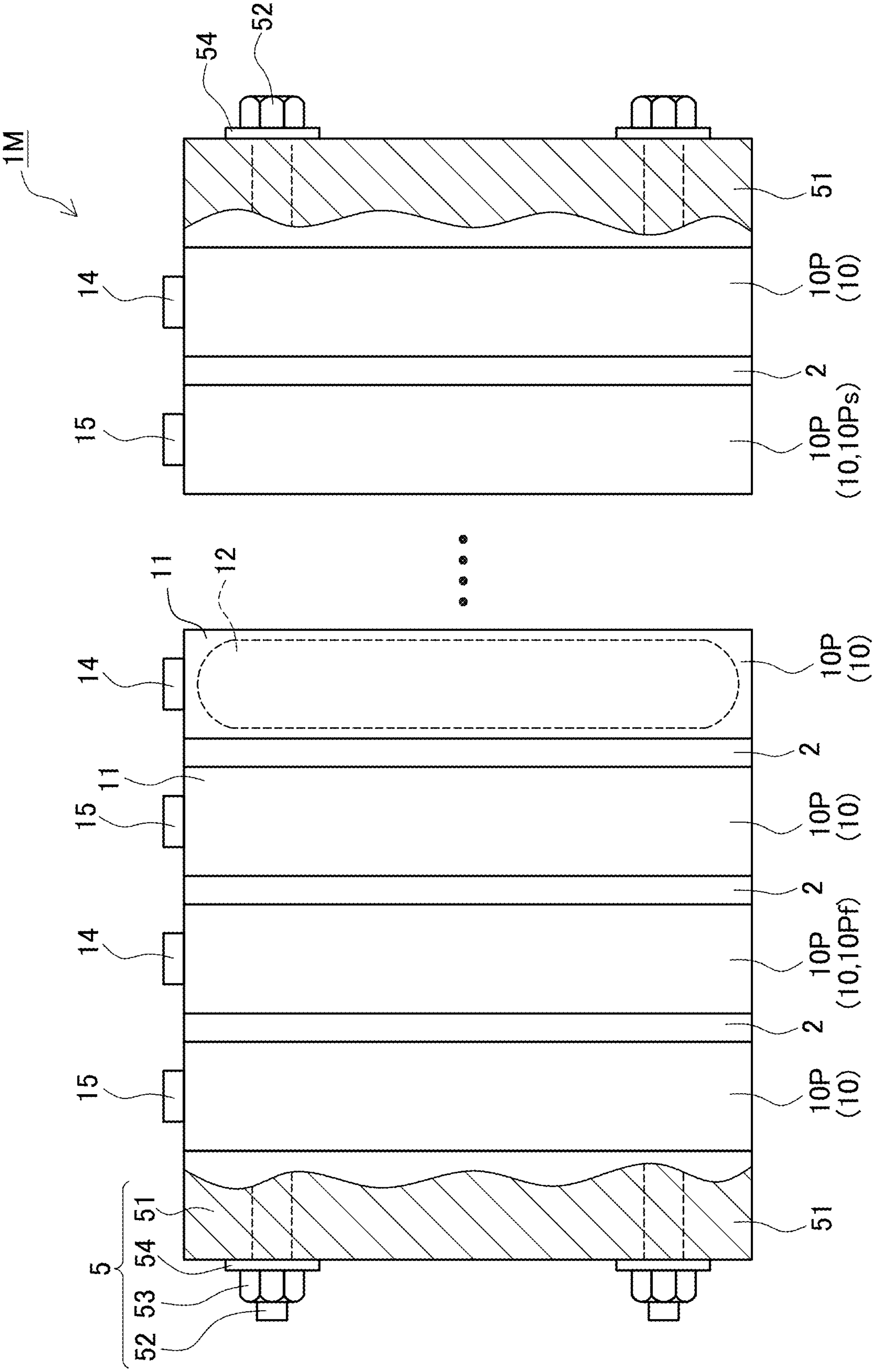
FIG. 2 is an explanatory diagram of an unconnected battery stack in the embodiment.

More specifically, in the calculating step S44, a largest adjustment timing difference ΔTcx is calculated, which is a time difference between the oldest adjustment completion time Tcf of an oldest restrained battery 10Pf whose adjustment completion time Tc is oldest and the newest adjustment completion time Tcs of a newest restrained battery 10Ps whose adjustment completion time Tc is newest, among the restrained batteries 10P included in the single unconnected battery stack 1M. For instance, in the foregoing example, the largest adjustment timing difference ΔTcx is 10.0 days (ΔTcx=10.0 days (=240 hours)) (see FIG. 7). This case is shown in FIG. 2 where the second restrained battery 10P from the left is the oldest restrained battery 10Pf and the second restrained battery 10P from the right is the newest restrained battery 10Ps.

In the following obtaining step S45, a shortest standby time WTmin from the newest adjustment completion time Tcs until the pre-leaving voltage measuring step S471 is allowed to start, e.g., WTmin=15.0 days, is obtained based on a standby time function F(ΔTcx) obtained in advance. The above-mentioned standby time function F(ΔTcx) is a function for obtaining the shortest standby time WTmin from the largest adjustment timing difference ΔTcx, in which the shortest standby time WTmin obtained is longer as the largest adjustment timing difference ΔTcx is larger.

If the newest adjustment completion time Tcs (date and time) is well-known as well as the largest adjustment timing difference ΔTcx, an earliest start timing SST (date and time) that allows the start of the restraint short-circuit inspecting step S47 may be obtained based on the standby time function F(ΔTcx), instead of or alternatively together with the shortest standby time WTmin. The shortest standby time WTmin and the earliest start timing SST can be obtained based on the standby time function F(ΔTcx). The shortest standby time WTmin can be calculated each time using the standby time function F(ΔTcx). Alternatively, the shortest standby time WTmin and the earliest start timing SST may be obtained using a graph of the standby time function F(ΔTcx) and a table prepared in advance showing the relationship between the largest adjustment timing difference ΔTcx and the shortest standby time WTmin or the earliest start timing SST.

In the following deferring step S46, the execution of the pre-leaving voltage measuring step S471 is deferred until the shortest standby time WTmin (e.g., WTmin=15.0 days) obtained from the newest adjustment completion time Tcs in the obtaining step S45 passes or until the earliest start timing SST (date and time) corresponding to the shortest standby time WTmin is reached. After deferment, when the above condition is satisfied, the restraint short-circuit inspecting step S47 (i.e., the pre-leaving voltage measuring step S471 to the restraint short-circuit determining step S475), and the connecting step S5 or a set of the removing step S6 and the re-restraining step S7 are performed. Thus, the battery stack 1 (see FIG. 1) can be completed.

Moreover, for example, the aforementioned example (see FIG. 7) shows that when the pre-leaving voltage measuring step S471 is performed after a lapse of 5.0 days from the newest adjustment completion time Tcs, the new restrained battery 10P may be erroneously determined to be a defective battery 10N.

In contrast, in the deferring step S46, when the pre-leaving voltage measuring step S471 is deferred to start until the shortest standby time WTmin (=15.0 days) elapses from the newest adjustment completion time Tcs, the old twenty-seven restrained batteries 10P as shown by the left graph line in FIG. 7 each have a third voltage drop rate DVB3*f*' which is calculated from a third voltage drop amount ΔVB3*f*' corresponding to a difference between a pre-leaving third voltage VB3*fa*' and a post-leaving third voltage VB3*fb*' and is smaller than the third voltage drop rate DVB3*f* in the aforementioned case with no deferment (DVB3*f*'<DVB3*f*). In contrast, the one new restrained battery 10P as shown in the right graph line in FIG. 7 has a third voltage drop rate DVB3*s*' which is calculated from a third voltage drop amount ΔVB3*s*' corresponding to a difference between a pre-leaving third voltage VB3*sa*' and a post-leaving third voltage VB3*sb*' and is smaller than the third voltage drop rate DVB3*s* in the aforementioned case with no deferment (DVB3*s*'<DVB3*s*). In addition, a difference between the third voltage drop rate DVB3*s*' and the third voltage drop rate DVB3*f*' (DVB3*s*'−DVB3*f*') is also smaller than a difference between the third voltage drop rate DVB3*s* and the third voltage drop rate DVB3*f* in the aforementioned case with no deferment (DVB3*s*−DVB3*f*) (see FIG. 7). Thus, when the start of the pre-leaving voltage measuring step S471 is deferred by the deferring step S46 and then the pre-leaving voltage measuring step S471 to the restraint short-circuit determining step S475 are performed in the same manner as above, it is possible to reduce the risk that the single new restrained battery 10P is erroneously determined to be a defective battery 10N in the restraint short-circuit determining step S475.

When the adjustment completion times Tc of a group of the restrained batteries 10P forming the single unconnected battery stack 1M are almost the same and thus the largest adjustment timing difference ΔTcx is small, the shortest standby time WTmin is obtained as a small value. In this case, the time from the end of the voltage adjusting step S41 to the start of the pre-leaving voltage measuring step S471 is longer than the obtained shortest standby time WTmin, so that the deferment by the deferring step S46 may be not performed practically or may be performed for a very short.

According to the aforementioned short-circuit inspecting method and the manufacturing method, as described above, if the adjustment completion times Tc of the restrained batteries 10P included in the single unconnected battery stack 1M are approximately the same (i.e., matched) timing, regardless of whether the adjustment completion times Tc are old or new, the pre-leaving voltage measuring step S471 is started immediately without deferment or with a short deferment to perform the restraint short-circuit inspecting step S47, so that each restrained battery 10P can be appropriately determined to be short-circuited or not. In contrast, if the adjustment completion times Tc are not matched, the pre-leaving voltage measuring step S471 is deferred according to the magnitude of the largest adjustment timing difference ΔTcx, so that all of the restrained batteries 10P included in the single unconnected battery stack 1M, that is, the oldest restrained battery(s) 10Pf and the newest restrained battery(s) 10Ps, can be appropriately determined to be short-circuited or not, regardless of the timing of each adjustment completion time Tc.

Figure 8:
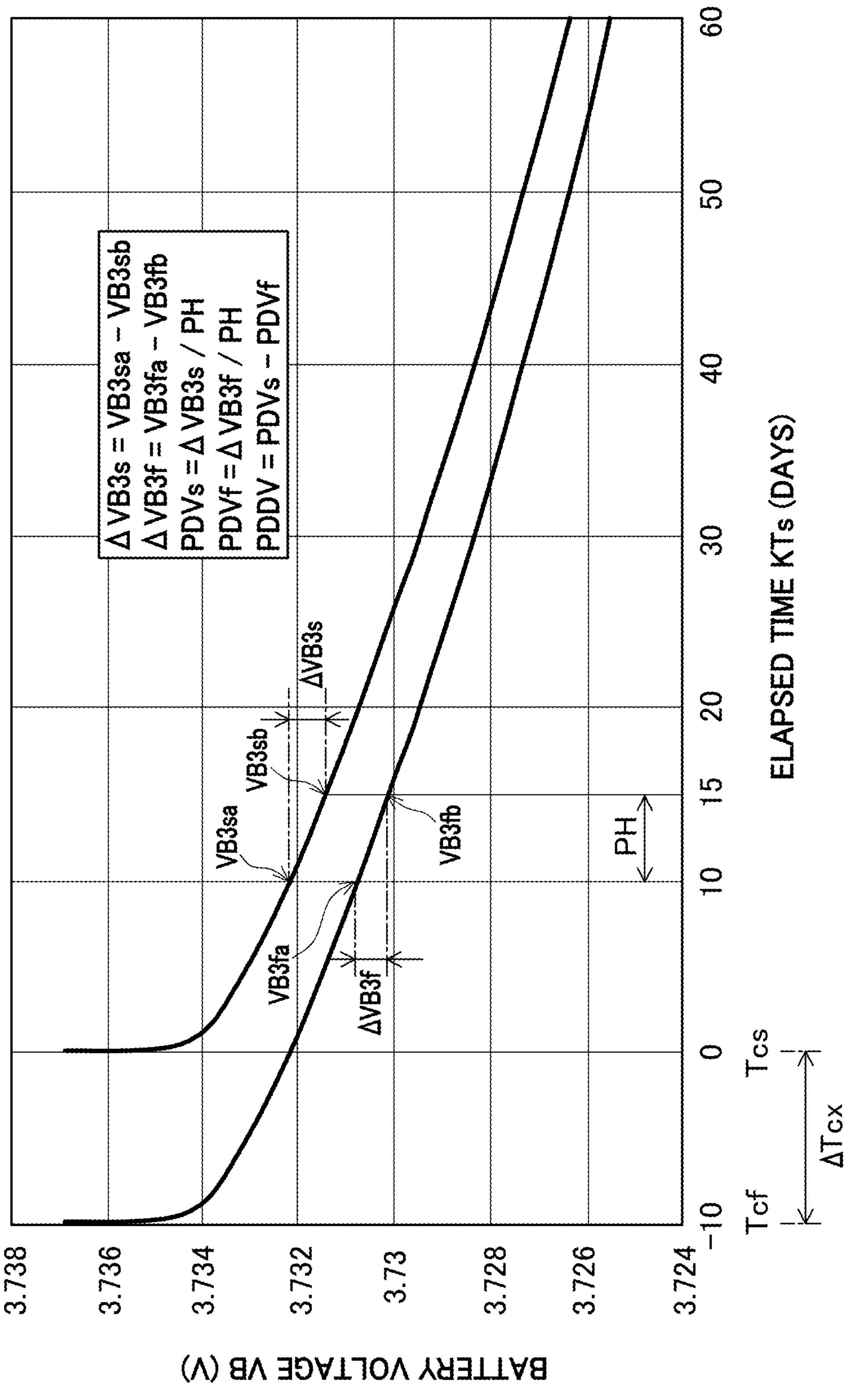
FIG. 8 is a graph showing a largest adjustment timing difference between an oldest restrained battery and a newest restrained battery and a relationship between an elapsed time and a predicted drop rate difference, utilizing the graph of FIG. 6.

The aforementioned standby time function F(ΔTcx) is obtained in advance, for example, by using the relationship between the elapsed time KT and the battery voltage VB from the adjustment completion time Tc, which are obtained in advance for batteries 10 of the same lot or of the same model number. The details thereof will be described referring to FIG. 8 equivalent to s FIG. 7 mentioned above. Two graph lines in FIG. 8 represent the case where a largest adjustment timing difference ΔTcx in a group of the restrained batteries 10P included in the single unconnected battery stack 1M is 10.0 days (ΔTcx=10.0 days), as can be understood from the aforementioned description. Then, the restraint leaving period PH in the restraint leaving step S472 is set to an appropriate period, for example, PH=5.0 days.

It is therefore possible to obtain, from the left graph line in FIG. 8, an oldest predicted drop rate PDVf, which is the third voltage drop rate DVB3*f* predicted to occur in the oldest restrained battery 10Pf, in correspondence with each elapsed time KTs. Further, it is also possible to obtain, from the right graph line in FIG. 8, a newest predicted drop rate PDVs, which is the third voltage drop rate DVB3*s* predicted to occur in the newest restrained battery 10Ps, in correspondence with each elapsed time KTs. FIG. 8 shows the example that the elapsed time KTs=10.0 days and the restraint leaving period PH=5.0 days.

Furthermore, a predicted drop rate difference PDDV corresponding to the same elapsed time KTs can also be obtained by subtracting the oldest predicted drop rate PDVf from the newest predicted drop rate PDVs (PDDV=PDVs−PDVf). This predicted drop rate difference PDDV becomes smaller as the elapsed time KTs elapses. Thus, the minimum elapsed time KTs for which this predicted drop rate difference PDDV becomes a predetermined upper-limit drop rate difference UPDDV or less is set as the aforementioned shortest standby time WTmin. Since the shortest standby time WTmin is obtained for each largest adjustment timing difference ΔTcx as above, it is possible to easily obtain the standby time function F(ΔTcx), and the graph and the table based on this function.

The upper-limit drop rate difference UPDDV can be any appropriate value, but preferably it is a smaller value than the fluctuations of the predicted drop rate PDV that can occur between the batteries 10 having almost the same adjustment completion time Tc. This is because the variations of the predicted drop rate PDV due to differences in adjustment completion time Tc are hidden by the fluctuations of the predicted drop rate PDV that occur between the batteries 10.

According to the method for inspecting the batteries 10 for short circuit and the method for manufacturing the batteries 10 in the present embodiment, when the adjustment completion times Tc of the restrained batteries 10P included in the battery stack 1 are approximately the same timing, regardless of whether the adjustment completion times Tc are old or new, the pre-leaving voltage measuring step S471 is started immediately without deferment or with a short deferment to perform the restraint short-circuit inspecting step S47, so that each restrained battery 10P (battery 10) can be appropriately determined to be short-circuited or not. In contrast, even if the adjustment completion times Tc are not matched, the pre-leaving voltage measuring step S471 is deferred according to the largest adjustment timing difference ΔTcx. This enables to appropriately determine whether or not each of the batteries 10 is short-circuited, i.e., from the oldest restrained battery(s) 10Pf to the newest restrained battery(s) 10Ps, regardless of the timing of the adjustment completion time Tc, that is, regardless of the length of the elapsed time KT from the adjustment completion time Tc.

The present disclosure is described in the embodiments, but is not limited thereto. The present disclosure may be embodied in other specific forms without departing from the essential characteristics thereof.

For instance, the battery stack 1 in the aforementioned embodiment is constituted of the restrained batteries 10P that are electrically connected in series to each other through the bus bars 3. As an alternative, a restrained-device module may be constituted of the restrained batteries 10P that are electrically connected in parallel to each other.

REFERENCE SIGNS LIST

1 Battery stack (Connected restrained-device module)
1M Unconnected battery stack (Restrained-device module)
SH Stacking direction
3 Bus bar
5 Restraining member
10 Battery (Secondary battery, Power storage device)
10N Defective battery
10H Supplementary battery (Restrained device)
10Pf Oldest restrained battery (Oldest adjusted device)
10Ps Newest restrained battery (Newest adjusted device)
VB Battery voltage
VB1 First voltage (First device voltage)
VB3*a*, VB3*fa*, VB3*sa*, VB3*fa*', VB3*sa*' Pre-leaving third voltage (Pre-leaving device voltage)
VB3*b*, VB3*fb*, VB3*sb*, VB3*fb*', VB3*sb*' Post-leaving third voltage (Post-leaving device voltage)
DVB3, DVB3*f*, DVB3*s*, DVB3*f*', DVB3*s*' Third voltage drop rate
ADVB3 Average drop rate
Tc Adjustment completion time
Tcf Oldest adjustment completion time
Tcs Newest adjustment completion time
KT, KTs Elapsed time
ΔTcx Largest adjustment timing difference
SST Earliest start timing
PDVf Oldest predicted drop rate (Second predicted drop rate)
PDVs Newest predicted drop rate (First predicted drop rate)
PDDV Predicted drop rate difference
S1 Initial charging step
S4 Short-circuit inspecting and restraining step
S41 Voltage adjusting step
IH Individual leaving period
S43 Restraining step
S44 Calculating step
S45 Obtaining step
S46 Deferring step
S47 Restraint short-circuit inspecting step (Short-circuit inspecting step)
S471 Pre-leaving voltage measuring step
S472 Restraint leaving step
PH Restraint leaving period
S473 Post-leaving voltage measuring step
S474 Voltage drop rate obtaining step
S475 Restraint short-circuit determining step
S5 Connecting step
S6 Removing step
S7 Re-restraining step

What is claimed is:

1. A power storage device inspecting method, comprising:

adjusting a voltage of a power storage device, which has been initially charged, to a first device voltage by charging or discharging the power storage device;

restraining a plurality of the power storage devices each having been adjusted to the first device voltage by a restraining member while the power storage devices are unconnected to each other, to constitute a restrained-device module including a plurality of restrained devices which are the power storage devices under restraint;

measuring a pre-leaving device voltage of each of the restrained devices included in a single restrained-device module;

leaving the restrained-device module that has been measured for the pre-leaving device voltage to stand with terminals of each of the restrained devices in an open state for a predetermined leaving period, wherein the pre-leaving device voltage is a device voltage measured before said leaving;

measuring a post-leaving device voltage, which is a device voltage measured after said leaving, of each of the restrained devices included in the single restrained-device module after said leaving the restrained-device module;

obtaining a voltage drop rate based on the pre-leaving device voltage and the post-leaving device voltage for each of the restrained devices;

determining whether or not each of the restrained devices included in the single restrained-device module is short-circuited by comparing the voltage drop rate of each of the restrained devices included in this restrained-device module, which are obtained in said obtaining the voltage drop rate, with a reference drop rate obtained from the voltage drop rates of the restrained devices included in this restrained-device module;

removing at least one restrained device having been determined to be short-circuited in said determining from among the restrained devices included in the restrained-device module;

after said adjusting the voltage of the power storage device but before said measuring the pre-leaving device voltage, calculating a largest adjustment timing difference that is a time difference between an oldest adjustment completion time of an oldest adjusted device that is completely adjusted to the first device voltage at an adjustment completion time that is oldest and a newest adjustment completion time of a newest adjusted device that is completely adjusted to the first device voltage at an adjustment completion time that is newest from among the restrained devices included in the single restrained-device module;

obtaining either a shortest standby time or an earliest start timing that allows start of measuring the pre-leaving device voltage, from the largest adjustment timing difference, based on a predetermined standby time function for obtaining the shortest standby time after the newest adjustment completion time until the start of said measuring the pre-leaving device voltage is allowed, in which the shortest standby time is obtained longer as the largest adjustment timing difference is larger; and deferring said measuring the pre-leaving device voltage until the shortest standby time elapses or until the earliest start timing is reached.

2. The power storage device inspecting method according to claim 1, wherein the shortest standby time is a shortest elapsed time predicted such that a predicted drop rate difference falls below a predetermined upper-limit drop rate difference, the predicted drop rate difference being obtained by subtracting a second predicted drop rate corresponding to the voltage drop rate predicted to occur in the oldest adjusted device from a first predicted drop rate corresponding to the voltage drop rate predicted to occur in the newest adjusted device.

3. A method for manufacturing a connected restrained-device module, the method comprising:

inspecting whether or not each of restrained devices included in a single restrained-device module is short-circuited by a power storage device inspecting method; and connecting the restrained devices included in the single restrained-device module to each other when all of the restrained devices included in the restrained-device module are determined not to be short-circuited, wherein the power storage device inspecting method comprises:

adjusting a voltage of a power storage device, which has been initially charged, to a first device voltage by charging or discharging the power storage device;

restraining a plurality of the power storage devices each having been adjusted to the first device voltage by a restraining member while the power storage devices are unconnected to each other, to constitute a restrained-device module including a plurality of restrained devices which are the power storage devices under restraint;

measuring a pre-leaving device voltage of each of the restrained devices included in a single restrained-device module;

leaving the restrained-device module that has been measured for the pre-leaving device voltage to stand with terminals of each of the restrained devices in an open state for a predetermined leaving period, wherein the pre-leaving device voltage is a device voltage measured before said leaving;

measuring a post-leaving device voltage, which is a device voltage measured after said leaving, of each of the restrained devices included in the single restrained-device module after said leaving the restrained-device module;

obtaining a voltage drop rate based on the pre-leaving device voltage and the post-leaving device voltage for each of the restrained devices;

determining whether or not each of the restrained devices included in the single restrained-device module is short-circuited by comparing the voltage drop rate of each of the restrained devices included in this restrained-device module, which are obtained in said obtaining the voltage drop rate, with a reference drop rate obtained from the voltage drop rates of the restrained devices included in this restrained-device module;

removing at least one restrained device having been determined to be short-circuited in said determining from among the restrained devices included in the restrained-device module;

after said adjusting the voltage of the power storage device but before said measuring the pre-leaving device voltage, calculating a largest adjustment timing difference that is a time difference between an oldest adjustment completion time of an oldest adjusted device that is completely adjusted to the first device voltage at an adjustment completion time that is oldest and a newest adjustment completion time of a newest adjusted device that is completely adjusted to the first device voltage at an adjustment completion time that is newest from among the restrained devices included in the single restrained-device module;

obtaining either a shortest standby time or an earliest start timing that allows start of measuring the pre-leaving device voltage, from the largest adjustment timing difference, based on a predetermined standby time function for obtaining the shortest standby time after the newest adjustment completion time until the start of said measuring the pre-leaving device voltage is allowed, in which the shortest standby time is obtained longer as the largest adjustment timing difference is larger; and deferring said measuring the pre-leaving device voltage until the shortest standby time elapses or until the earliest start timing is reached.

4. The method for manufacturing the connected restrained-device module according to claim 3, wherein the restrained-device module comprises a plurality of restrained-device modules, and the method further comprises:

re-restraining the remaining restrained devices that are included in the restrained-device module, from which the at least one restrained device has been removed in said removing, and determined not to be short-circuited in said determining together with a supplementary power storage device that is prepared in advance to reconstitute a re-restrained-device module, the supplementary power storage device having been included in another restrained-device module of the restrained-device modules and determined not to be short-circuited in said inspecting.

5. A method for manufacturing a connected restrained-device module, the method comprising:

inspecting whether or not each of restrained devices included in a single restrained-device module is short-circuited by a power storage device inspecting method; and connecting the restrained devices included in the single restrained-device module to each other when all of the restrained devices included in the restrained-device module are determined not to be short-circuited, wherein the power storage device inspecting method comprises:

adjusting a voltage of a power storage device, which has been initially charged, to a first device voltage by charging or discharging the power storage device;

restraining a plurality of the power storage devices each having been adjusted to the first device voltage by a restraining member while the power storage devices are unconnected to each other, to constitute a restrained-device module including a plurality of restrained devices which are the power storage devices under restraint;

measuring a pre-leaving device voltage of each of the restrained devices included in a single restrained-device module;

leaving the restrained-device module that has been measured for the pre-leaving device voltage to stand with terminals of each of the restrained devices in an open state for a predetermined leaving period, wherein the pre-leaving device voltage is a device voltage measured before said leaving;

measuring a post-leaving device voltage, which is a device voltage measured after said leaving, of each of the restrained devices included in the single restrained-device module after said leaving the restrained-device module;

obtaining a voltage drop rate based on the pre-leaving device voltage and the post-leaving device voltage for each of the restrained devices;

determining whether or not each of the restrained devices included in the single restrained-device module is short-circuited by comparing the voltage drop rate of each of the restrained devices included in this restrained-device module, which are obtained in said obtaining the voltage drop rate, with a reference drop rate obtained from the voltage drop rates of the restrained devices included in this restrained-device module;

removing at least one restrained device having been determined to be short-circuited in said determining from among the restrained devices included in the restrained-device module;

after said adjusting the voltage of the power storage device but before said measuring the pre-leaving device voltage, calculating a largest adjustment timing difference that is a time difference between an oldest adjustment completion time of an oldest adjusted device that is completely adjusted to the first device voltage at an adjustment completion time that is oldest and a newest adjustment completion time of a newest adjusted device that is completely adjusted to the first device voltage at an adjustment completion time that is newest from among the restrained devices included in the single restrained-device module;

obtaining either a shortest standby time or an earliest start timing that allows start of measuring the pre-leaving device voltage, from the largest adjustment timing difference, based on a predetermined standby time function for obtaining the shortest standby time after the newest adjustment completion time until the start of said measuring the pre-leaving device voltage is allowed, in which the shortest standby time is obtained longer as the largest adjustment timing difference is larger; and deferring said measuring the pre-leaving device voltage until the shortest standby time elapses or until the earliest start timing is reached, and the shortest standby time is a shortest elapsed time predicted such that a predicted drop rate difference falls below a predetermined upper-limit drop rate difference, the predicted drop rate difference being obtained by subtracting a second predicted drop rate corresponding to the voltage drop rate predicted to occur in the oldest adjusted device from a first predicted drop rate corresponding to the voltage drop rate predicted to occur in the newest adjusted device.

6. The method for manufacturing the connected restrained-device module according to claim 5, wherein the restrained-device module comprises a plurality of restrained-device modules, and the method further comprises:

re-restraining the remaining restrained devices that are included in the restrained-device module from which the at least one restrained device has been removed in said removing, and determined not to be short-circuited in said determining together with a supplementary power storage device that is prepared in advance to reconstitute a re-restrained-device module, the supplementary power storage device having been included in another restrained-device module of the restrained-device modules and determined not to be short-circuited in said inspecting.

* * * * *